United States Patent [19]

Hundt

[11] Patent Number: 5,289,034
[45] Date of Patent: Feb. 22, 1994

[54] IC PACKAGE HAVING REPLACEABLE BACKUP BATTERY

[75] Inventor: Michael J. Hundt, Lewisville, Tex.

[73] Assignee: SGS-Thomson Microelectronics, Inc., Carrollton, Tex.

[21] Appl. No.: 34,584

[22] Filed: Mar. 22, 1993

Related U.S. Application Data

[63] Continuation of Ser. No. 690,378, Apr. 23, 1991, abandoned, which is a continuation of Ser. No. 470,939, Jan. 26, 1990, abandoned.

[51] Int. Cl.⁵ .................. H01L 23/48; H01L 23/02; H01L 23/12; G11C 7/00
[52] U.S. Cl. .................................. 257/678; 257/666; 257/691; 257/692; 257/787; 257/924; 365/228; 365/229
[58] Field of Search ......... 361/392, 394, 401, 395.380; 340/825.31; 365/229, 226, 228; 357/74, 72, 75; 368/203, 204, 205; 257/678, 666, 691, 692, 787, 788, 798, 928, 924

[56] References Cited

U.S. PATENT DOCUMENTS

| Re. 32,200 | 7/1986 | Lee et al. | 365/229 |
|---|---|---|---|
| 4,511,796 | 4/1985 | Aigo | 361/401 |
| 4,539,660 | 9/1985 | Miyauchi et al. | 357/74 |
| 4,645,943 | 2/1987 | Smith, Jr. et al. | 361/401 |
| 4,763,308 | 8/1988 | Morata | 368/204 |
| 4,823,323 | 4/1989 | Higuchi | 365/228 |
| 5,055,704 | 10/1991 | Link et al. | 365/229 |

FOREIGN PATENT DOCUMENTS

0165152 1/1989 Japan .................................. 357/74

Primary Examiner—Andrew J. James
Assistant Examiner—Carl Whitehead, Jr.
Attorney, Agent, or Firm—Dennis T. Griggs; Kenneth C. Hill; Richard K. Robinson

[57] ABSTRACT

A premolded battery package supports a volatile memory chip and a replaceable backup battery for preserving data in the event of loss of main power supply. The package includes an integrally formed external socket for receiving a replaceable backup battery which can be manually inserted into or removed from the socket after molding encapsulation and metal trim work have been completed. The socket assembly includes an interface battery cavity which permits the negative terminal of a backup battery to engage a negative power finger lead. The positive battery terminal is engaged by a resilient terminal contact portion of a positive finger lead which projects externally of the molded package. The terminal contact portion of the positive power lead serves as a retainer in combination with socket shoulder portions for retaining the backup battery within the socket.

18 Claims, 4 Drawing Sheets

IC PACKAGE HAVING REPLACEABLE BACKUP BATTERY

This is a continuation of application Ser. No. 07/690,378 filed Apr. 23, 1991 (abandoned) which is a continuation of application Ser. No. 07/470,939 filed Jan. 26, 1990 (abandoned.)

FIELD OF THE INVENTION

This invention relates generally to packaging for semiconductor devices, and in particular to an integrated circuit package which supports a semiconductor memory chip and a backup battery for preserving data in the event of loss of main power supply.

1. Background of the Invention

Conventional electronic circuit packages for semiconductor integrated circuit chips are adapted to enclose and seal the chip devices, while also providing heat dissipation, structural support, electrical attachment of device leads to external pin connectors, and electrical interconnection with other devices in the package. Such packages are usually formed of one or more layers of a non-conductive material, having a central cavity in which a semiconductor chip is received. Flexible metal leads are extended from the central cavity for connecting the device input/output leads to a printed circuit board in a host electronic circuit.

An important integrated circuit product which is implemented on an IC chip encapsulated within an integrated circuit package includes a volatile semiconductor memory such as the static random access memory (SRAM) which is characterized by low power consumption and high memory cell density. The generation of valid logic signals and the retention of data in such integrated memory circuits having volatile memory cells depend in part on maintenance of power supply voltages within specified limits. In conventional integrated circuit memory devices, internal circuits sense the external voltage being applied to determine if it is sufficient for reliable operation. In response to a low voltage condition, control signals are generated which cause active chips to be de-selected and maintained in standby condition. This is usually carried out by means of true and complement chip select signals, CS and $\overline{\text{CS}}$, respectively, which inhibit read/write operations until the low voltage condition has been corrected.

During the period that a memory chip is in the unselected condition it is necessary to maintain the charge levels of the storage capacitors in the volatile memory cells so that stored data will be retained. Otherwise, the information stored in the memory cells, including programs and data, will be lost when main power is removed. Although the loss of power does not result in memory circuit damage, the loss of stored information requires that the memory be reloaded with programs and data before processing can be reestablished.

2. Description of the Prior Art

It has been proposed to solve the data loss problem by using an additional pin terminal on memory semiconductor circuits and that the additional terminal be supplied with backup power from a remote source to maintain the data in the memory cells. However, there are now established standardized pin patterns for most integrated circuit memories; consequently, the addition of another pin dedicated to a remote backup power supply would not be compatible with standard pin patterns, and would require a substantial redesign of existing circuits.

Accordingly, there exists a need for a semiconductor memory package for supporting a memory chip and a backup battery wherein the socket area and standard pin configuration are not affected, and stored data are retained despite a loss of the main power supply.

A substantial portion of the cost and size of a packaged chip is attributable to package fabrication, and two important design criteria in addition to providing a reliable electrical connection are cost effectiveness and space efficiency. A need thus exists for an improved device package for safely supporting an integrated circuit chip and an on-package backup battery wherein the package is provided with pin connectors formed therein for plug-in compatibility with standard printed circuit sockets, and the packaging space required for supporting the backup battery is minimized.

Packages are needed for integrated circuit memory devices which include a battery molded within the body of the package. However, when the assembly is heated to the temperature necessary to perform encapsulation, the electrolyte within the backup battery evaporates and the battery charge is destroyed. Accordingly, there is continuing interest in developing backup batteries which can withstand the high temperatures encountered during transfer molding and encapsulation. Until such batteries have been perfected, there is a need for an IC chip package which will permit a backup battery to be loaded after molding and encapsulation have been completed.

Although backup batteries are presently available which are rated for backup use for 10 years or more, the user may desire to replace the backup battery from time-to-time. For example, the user may desire to use a less expensive battery having a shorter life span and replace it from time-to-time, or replace an on-board backup battery with an improved backup battery when it becomes available. Additionally, the user may desire to substitute a new battery for a on-board backup battery which has been discharged by a short circuit or which otherwise has been damaged, for example, by exposure to high temperature operating conditions.

SUMMARY OF THE INVENTION

The present invention provides a package for encapsulating an integrated circuit device and overcomes the foregoing backup power limitations of the prior art by providing an integrally formed external socket for receiving a replaceable backup battery which can be manually inserted into or removed from the socket after molding encapsulation and metal trim work have been completed. In the preferred embodiment, a lead frame assembly including a base plate and multiple finger leads is secured onto a side surface of a first body of non-conductive material during a transfer mold operation. A second molded body of non-conductive material having a chip cavity and a battery cavity is assembled onto the first body, with the chip cavity being positioned in alignment with the base plate of the lead frame assembly, and with the battery cavity exposing a portion of a conductive power lead of the lead frame assembly.

The second molded body of non-conductive material includes shoulder portions defining a socket aligned with the battery cavity for receiving a backup battery of the type having positive and negative polarity contact members. The backup battery is manually insertable into the socket, with its negative polarity contact member being received within the battery cavity and engaged in electrical contact with the exposed conductive power lead. A second conductive power lead includes a resilient terminal contact portion which is disposed in electrical contacting engagement with the positive polarity contact member of the backup battery. The terminal contact portion of the second conductive power lead also serves as a retainer in combination with the socket shoulder portions for retaining the backup battery within the socket.

Operational features and advantages of the present invention will be appreciated by those skilled in the art upon reading the detailed description which follows in connection with the attached drawings, wherein:

DETAILED DESCRIPTION OF THE PREFERRED EMBODIMENT

In the description which follows, like parts are indicated throughout the specification and drawings with the same reference numerals, respectively. By way of example, the invention is described in combination with a static random access memory (SRAM) which is implemented by monolithic CMOS/LSI techniques on a N-type silicon semiconductor chip. It will be appreciated, however, that the packaging assembly of the invention may be used to encapsulate and provide replaceable backup battery power for discrete as well as integrated devices, but has particular utility for volatile memory integrated circuits having multiple input/output nodes. Accordingly, it should be understood that the invention in its broadest aspects may be incorporated in any moldable package which houses one or more circuit devices requiring backup power, including but not limited to discrete, micro-discrete and integrated circuit components, and hybrid combinations of discrete and integrated devices.

Figure 1:
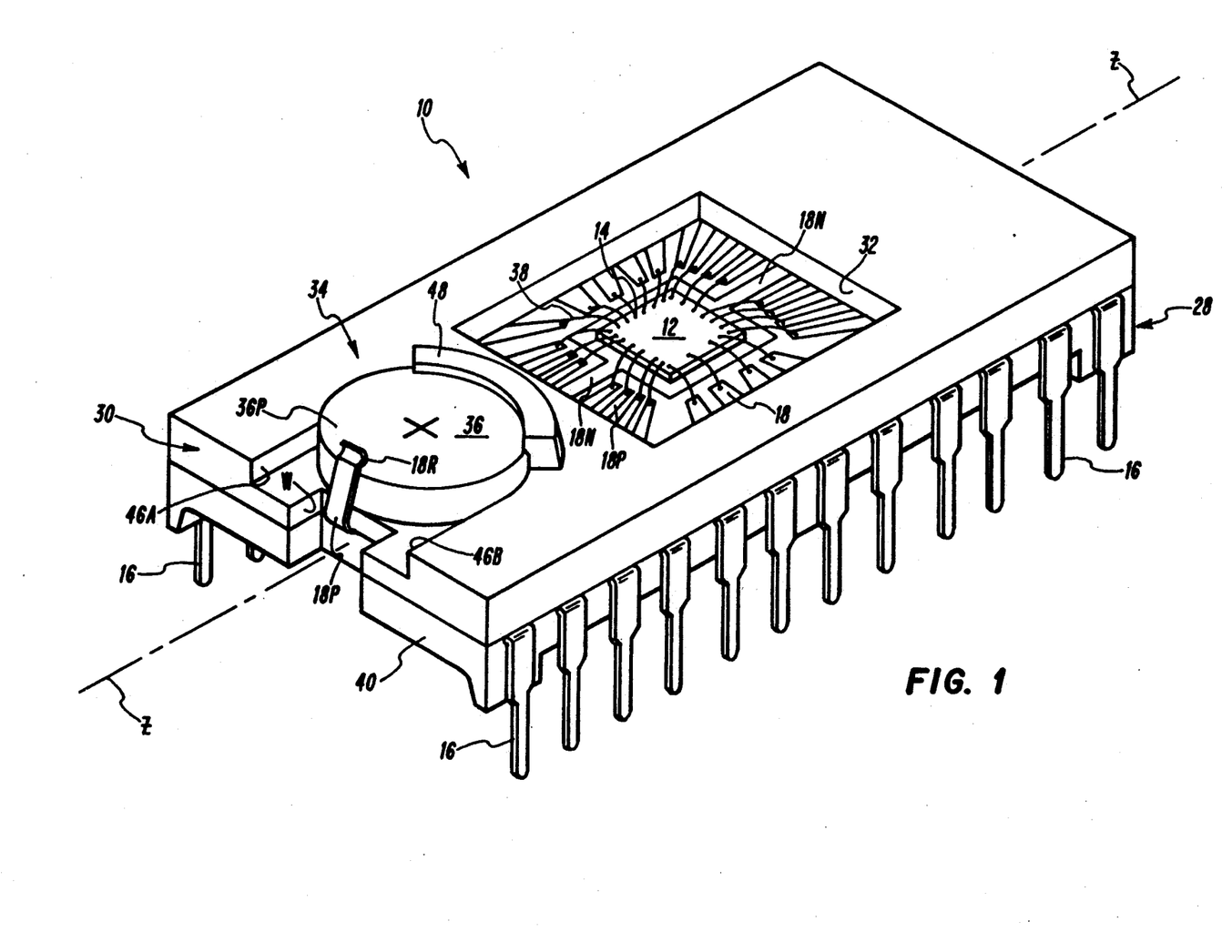
FIG. 1 is a perspective view of an integrated circuit chip package having a replaceable backup battery according to the present invention.

Referring now to FIG. 1, there is shown an exemplary semiconductor chip package 10 incorporating the present invention. The package 10 supports and encapsulates an integrated circuit chip 12 having input/output nodes 14. The IC chip 12 may be, for example, a 2K×8 static random access memory (SRAM) circuit which is characterized by low power consumption, high memory cell density and which is implemented by complementary metal oxide semiconductor (CMOS) technology.

The exemplary package 10 has a conventional dual-in-line pin configuration including 24 external connector pins arranged in two parallel rows with 600 mil spacing along the longitudinal edges of the package. The input/output nodes 14 of the integrated circuit chip 12 are electrically connected to selected connector pins 16 by conductive finger leads 18 of a lead frame assembly 20 as shown in FIG. 2.

Figure 2:
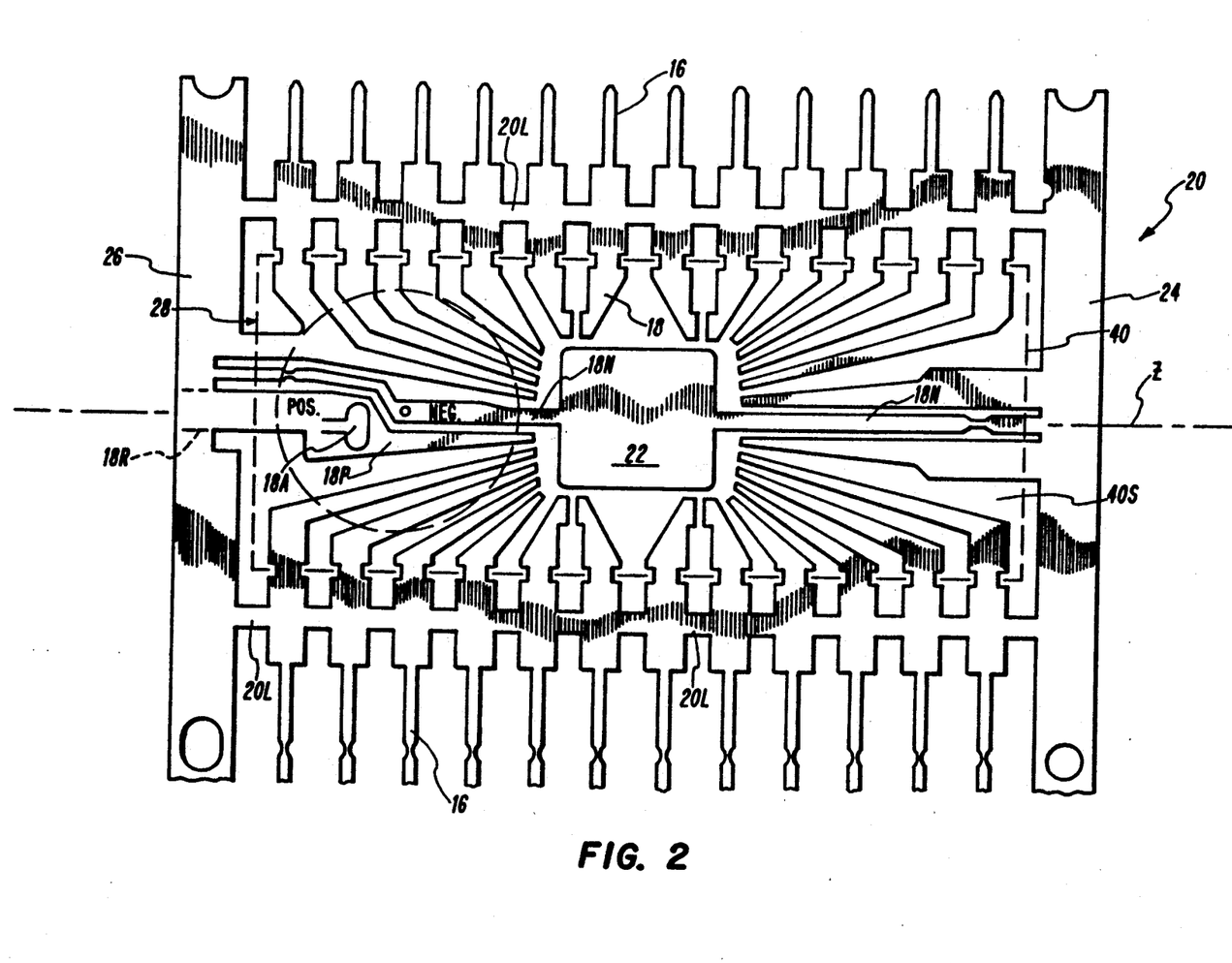
FIG. 2 is a plan view of a lead frame assembly which is incorporated in the semiconductor package of FIG. 1.

Referring to FIG. 2, the inner lead fingers 18 are spaced with respect to a central base plate 22 and are integrally formed with the connector pins 16. Connecting portions 20L of the lead frame assembly are ultimately trimmed away during manufacture, whereby each inner lead 18 is electrically connected to a single connector pin 16. Transport side rail strips 24, 26 on the outer perimeter of the lead frame 20 are also cut away during trim and form operations in the last stages of manufacture after molding has taken place.

The inner tips of the conductive fingers 18 are symmetrically spaced about the base plate 22. The inner tips of the conductive fingers 18 are relatively narrow, and the fingers expand substantially as they radiate outwardly from the base plate 22. The base plate 22, connector pins 16 and inner finger leads 18 are initially coplanar during molding. After molding, the connector pin portions 16 are bent through a 90 degree angle along the longitudinal side surfaces of the package during the trim and form operation.

The semiconductor chip package includes a pin subassembly 28 and a cover sub-assembly 30. The pin sub-assembly 28 provides a standard pin pattern for electrically connecting the input/output nodes 14 of the semiconductor chip 12 to a socket on a printed circuit board of a host electronic system or on some other semiconductor package. The cover sub-assembly 30 includes a non-conductive substrate 31 which is assembled onto the pin sub-assembly 28, and seals the lead frame assembly 20. Additionally, the cover sub-assembly 30 includes a cavity 32 in substrate 31 in which the semiconductor chip 12 is received and a socket 34 for receiving a backup battery 36.

Figure 4:
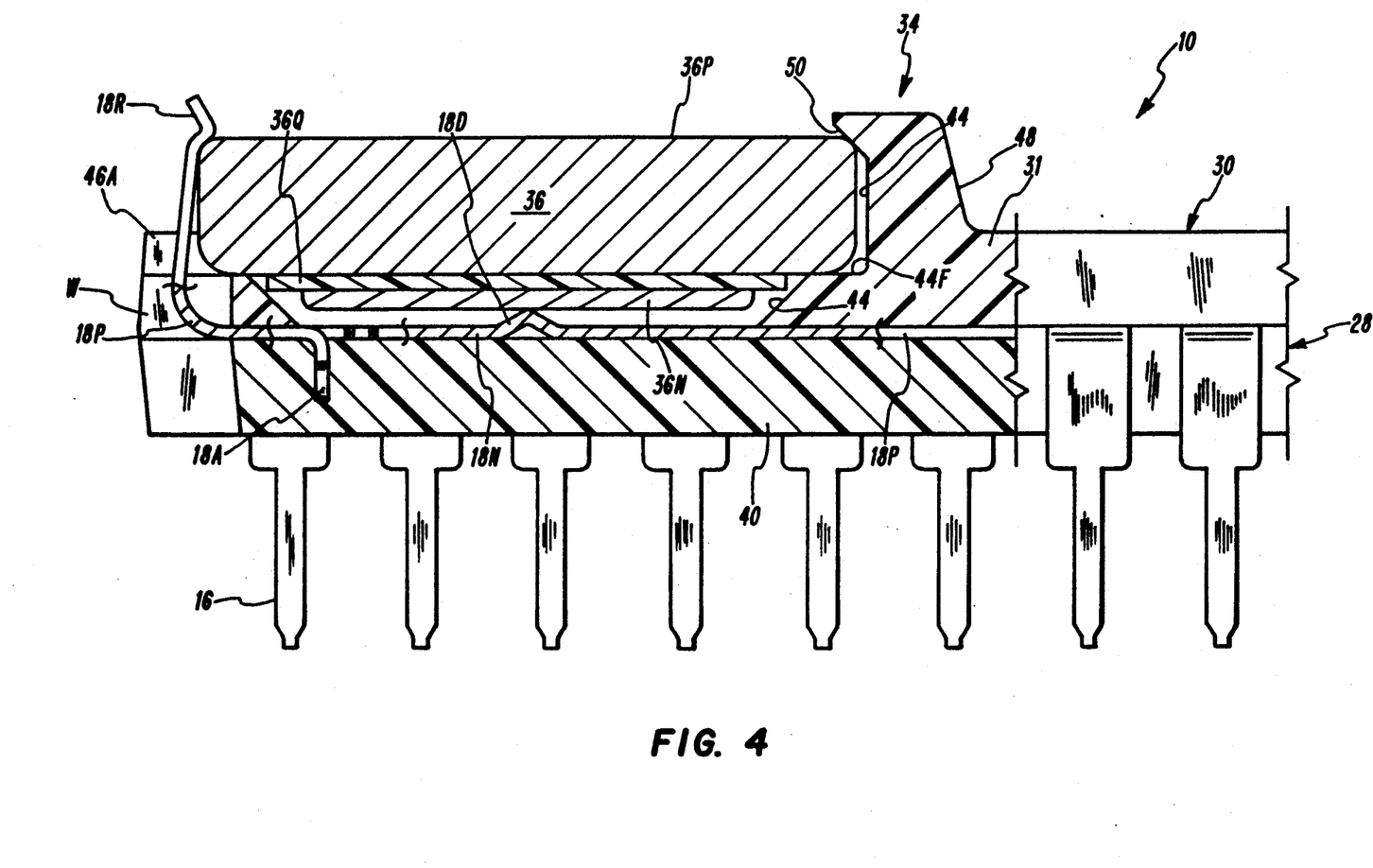

The battery 36 is preferably a 3-volt lithium cell having a 12 mm diameter. The battery 36 has a positive terminal 36P and a negative terminal 36N which is insulated with respect to the positive terminal by an annular layer of dielectric insulation 36Q, as shown in FIG. 4.

The semiconductor chip 12 is bonded to the base plate 22 by a conductive deposit of silver-filled epoxy adhesive such as Ablebond TM 84-1 which secures the chip 12 within the cavity 32. The input/output nodes 14 are electrically connected to selected ones of the conductive fingers 18 by fine gold wires 38 having a diameter of 1.3 mil. Bonding of the gold wires 38 to the conductive fingers 18 and I/O nodes 14 is preferably by the conventional thermosonic ball bonding technique.

After the integrated circuit chip 12 has been bonded to the base plate 22, and the ends of the fine gold wires 38 have been bonded, the lead frame assembly 20 is placed into the bottom half of a multi-cavity split mold. The mold cavity is closed in a transfer molding machine and a non-conductive encapsulant material such as polyphenolene sulfide is injected in fine pellet form from a nozzle. The pressure at which this injection takes place is closely controlled to prevent damage to the wire bonds. Under the appropriate pressure and temperature, for example, 200° C., the pellets melt and flow into channels within the mold and fill the cavities around the lead frame assembly 20. The resin is cured while still in the mold by the applied heat and pressure. Further curing takes place in an oven.

As a result of the foregoing mold procedure, the pin assembly 28 is produced in the form of an elongate, generally rectangular body 40 of non-conductive material, with the lead frame 20 being embedded in flush relation with the top surface 40S of the rectangular body as shown in FIG. 2. The lead frame 20 is further stabilized onto the pin assembly 28 by an anchor tab 18A which is embedded within the non-conductive body 40 during molding. The anchor tab 18A is integrally formed as a part of the positive finger lead 18P, and is stamped in the form of T outline as shown in FIG. 2 during fabrication the lead frame assembly 20. Prior to molding, the anchor tab 18A is turned downwardly through an angle of approximately 90 degrees, thereby securely anchoring the lead frame assembly 20 onto the top surface 40S of the non-conductive wafer substrate 40. After removal from the mold, the lateral cross pieces 20L between adjacent pins 16 in the lead frame assembly 20 are cut to separate and electrically isolate the pins and conductive finger strips from one another. Additionally, the transport side sections 24, 26 are also cut and separated from the molded assembly.

The lead frame 20 material preferably comprises a conventional metal material, such as a tin-plated nickel or iron alloy or, alternatively, a tin-plated copper alloy such as CDA 194. It will be appreciated that during assembly, the connector pins and inner conductive leads are structurally interconnected by the lateral segments 20L and by the side transport sections 24, 26, preferably stamped from the same metal strip. The connecting sections remain attached to the connector pins for handling purposes only and are severed prior to ultimate use.

A measured amount of a liquid encapsulating material, such as Amicon XT-5038-9 insulation compound (not shown), is injected into the cavity 32 for sealing and protecting the integrated circuit chip 12, the gold bond wires 38 and the exposed surfaces of the inner finger leads 18. The liquid encapsulating material solidifies upon curing, thereby providing structural cover as well as an environmental seal.

It will be understood that a selected one of the external pins 16 will be connected to a primary power supply node which provides a voltage $V_{CC}$ which is typically at +5.0 volts DC. Similarly, another connector pin will be connected to a ground node of a host electronic system for providing a ground-reference GND. Other pins are dedicated for true and complement chip select signals, CS and $\overline{CS}$, a signal CLK for synchronously clocking data to and from the monolithic integrated circuit 12, as well as various other I/O signals which are produced by the host electronic circuit. A comparator and switching circuit (not illustrated) compares the voltage $V_{CC}$ from the primary power supply of the host electronic circuit with the voltage of the backup battery 36 and automatically connects the highest detected voltage to power the integrated circuit 12.

According to one aspect of the invention, one of the conductive inner finger leads, designated 18N, is integrally formed with the base plate 22. The finger lead 18N extends across the lead frame support surface 40S generally along the longitudinal axis Z of the sub-assembly 40. Another one of the conductive inner finger leads, designated 18P, is radially spaced and isolated from the base plate 22, and also extends generally in alignment with the longitudinal axis Z of the pin sub-assembly 28. The inner conductive finger leads 18P and 18N are adapted for electrical contacting engagement with the positive terminal 36P and negative terminal 36N of the replaceable backup battery 36 as illustrated in FIG. 4.

In the preferred embodiment, electrical connection to the positive and negative terminals 36P, 36N of the replaceable backup battery 36 is accomplished by engaging the negative battery terminal 36N against the negative conductive lead 18N, as shown in FIG. 4. The positive terminal 36P is electrically engaged by a modified terminal end portion 18R of the positive inner lead 18P. Referring to FIG. 2 and FIG. 4, the side rail 26 is cut during a post molding cut and form operation to provide the extended terminal end portion 18R. A notch W is formed in the non-conductive substrate wafer 31 of cover subassembly 30 to accommodate flexure movement of the positive terminal end portion 18R. The terminal end portion 18R is bent vertically through the notch W as shown in FIG. 4 through an angle of approximately 120°, toward the socket 34, whereby the terminal end portion 18R applies a spring bias force against the positive contact surface 36P of the replaceable backup battery 36. The replaceable battery 36 is therefore securely received within the socket 34 which forms a part of the cover sub-assembly 30.

In one embodiment of the invention, the non-conductive wafer substrate 31 of the cover sub-assembly 30 is separately molded in a transfer molding machine in which non-conductive encapsulation material such as polyphenylene sulfide is injected. The mold cavity is provided with the appropriate mold structure to produce the chip cavity 32, a battery interface cavity 42, a socket cavity 44, the notch W, and a rectangular slot 46. After molding, the cover sub-assembly 30 is securely bonded onto the lead frame support surface 40S with the integrated circuit chip 12 centered within the chip cavity 32, and with the battery interface cavity 42 providing access to a surface portion of the negative finger lead 18N. The cover sub-assembly substrate 31 is bonded onto the lead frame support surface 40S of the pin subassembly 28 by any suitable means such as adhesives, ultrasonic welding, or staking. Accordingly, the interface between the pin sub-assembly 28 and the cover sub-assembly 30 is tightly sealed.

Figure 3:
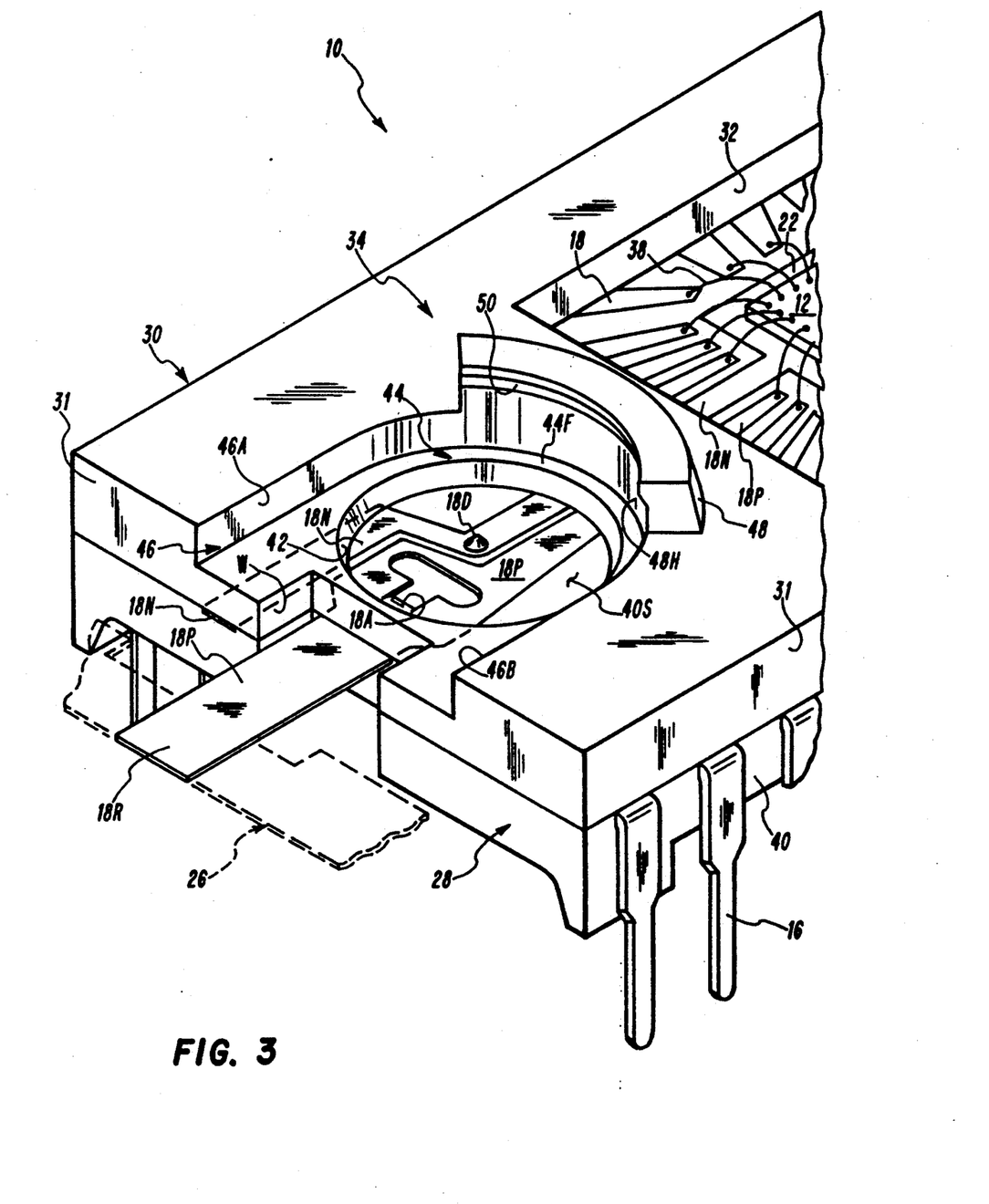
FIG. 3 is a perspective view of the semiconductor package shown in FIG. 1, partially broken away, with the backup battery removed from its socket; and, FIG. 4 is a side elevational view, partially broken away and partially in section, of the integrated circuit package of FIG. 1.

Referring now to FIG. 3, the socket cavity 44 is substantially concentric with the battery interface cavity 42, and the rectangular slot 46 is longitudinally aligned with and opens into the socket cavity 44. The socket cavity 44 is bounded by a semi-cylindrical shoulder 48 which rises above the top of the cover sub-assembly 30. The socket shoulder 48 has a beveled face 50, which in combination with the planar floor surface 44F of the socket cavity 44 receives and retains a side portion of the battery 36. The socket slot sidewalls 46A, 46B provide transverse support for the battery, and have a transverse spacing for receiving a battery having a 12 mm diameter.

During the step of inserting or removing the battery 36, the anode clip terminal portion 18R is deflected outwardly, to permit the battery to be inserted or removed. Upon release, the anode terminal portion 18R springs inwardly and applies a bias retaining force against the edge of the positive anode surface 36P.

Because the positive (anode) finger lead 18P as well as the negative (cathode) finger lead 18N are exposed by the battery interface cavity 42, a contact dimple 18D is formed in the cathode finger lead 18N for engaging the negative cathode terminal 36N of the battery 36. Moreover, multiple finger leads 18 are also exposed by the battery interface cavity 42. Accordingly, an encapsulating material such as Amicon XT-5038-9 insulation compound (not shown) is dispensed into the battery interface cavity 42 and forms a protective insulating layer over the exposed finger leads, but without covering the contact dimple 18D. The insulating layer prevents the formation of conductive bridges across adjacent finger leads 18 which might otherwise occur upon exposure to corrosive fluids. The contact dimple 18D allows electrical contact between the battery cathode terminal 36N and the negative finger lead 18N while preventing engagement against the other exposed finger leads 18, 18P.

Although the exemplary embodiment illustrated in FIGS. 1-4 utilizes a separately molded pin sub-assembly 22 and a cover sub-assembly 30, it will be understood by those skilled in the art that the pin sub-assembly substrate wafer 40 may be integrally formed with the cover sub-assembly substrate wafer 31 during molding in a multi-cavity split mold. In that molding operation, the lead frame assembly 20 is placed into the bottom half of a multi-cavity split mold, in engagement with appropriately formed standoff structures and cavities to define the socket assembly 34, the battery interface cavity 42, the socket shoulder 48 and the socket slot 46. In the integrally molded embodiment, the chip cavity 32 is not required, and the pressure in which the injection of the non-conductive encapsulant material takes place is closely controlled to prevent damage to the gold wire bonds, with the result that the integrated circuit chip 12, the gold wires 38 and the inner end portions of the finger leads 18 are completely encapsulated. Post molding fabrication of the integrally molded package is otherwise the same, with the positive retainer end terminal 18R being cut, formed and bent into its battery retaining position within notch W as shown in FIG. 4.

Although the invention has been described with reference to certain specific embodiments, and with reference to a package which encapsulates and provides replaceable backup battery power for an integrated circuit device, the foregoing description is not intended to be construed in a limiting sense. Various modifications of the disclosed premolded replaceable battery package as well as alternative applications thereof will be suggested to persons skilled in the art by the foregoing specification and illustrations. It is therefore contemplated that the appended claims will cover any such modifications or embodiments that fall within the true scope of the invention.

What is claimed is:

1. A premolded package having an encapsulated electronic circuit device and having a socket for receiving a replaceable battery for providing electrical power to said electronic circuit device comprising, in combination:
a body of non-conductive material;
a finger lead assembly encapsulated within said body of non-conductive material, said finger lead assembly including a plurality of conductive finger leads, with one of said finger leads defining a positive power lead and one of said finger leads defining a negative power lead, and exactly one of said power leads having a terminal contact portion projecting externally of said body of non-conductive material for electrical contacting engagement with a first power terminal of the replaceable battery, the terminal contact portion applying a bias retaining force against said first power terminal;
an electronic circuit device encapsulated within said body of non-conductive material, said electronic circuit device having positive and negative power nodes electrically coupled to said positive and negative power leads, respectively; and,
said body of non-conductive material having a socket for receiving a backup battery of the type having positive and negative polarity terminals, said socket exposing at a location interior to said body one of said conductive power leads for electrical contacting engagement with a second power terminal of the replaceable battery when such replaceable battery is loaded into said socket.

2. A premolded package as defined in claim 1, including:
a replaceable battery removably disposed within said socket, said replaceable battery having a first power terminal engaged in electrical contact with said exposed conductive power lead and having a second power terminal, the externally projecting terminal contact portion of the other conductive power lead being releasably disposed in electrical contacting engagement with the second power terminal when said replaceable battery is loaded into said socket.

3. A premolded package as defined in claim 1, wherein said finger lead assembly includes a base plate, and one of said finger leads is electrically connected to said base plate, wherein said electronic circuit device includes a power node electrically coupled to said base plate.

4. A premolded package as defined in claim 1, said body of non-conductive material including a shoulder portion having a semi-cylindrical sidewall defining a side boundary of said socket, and having a battery support surface abutting said cylindrical sidewall, said battery support surface being intersected by a battery interface cavity which exposes one of said conductive power leads and which opens into said socket.

5. A premolded package as defined in claim 1, said body of non-conductive material having a notch formed on a side edge thereof thereby defining a clearance opening through which the externally projecting terminal contact portion is extended for electrical contacting engagement with said first power terminal of the replaceable battery.

6. A premolded package as defined in claim 1, said second power lead having an anchor tab portion extending transversely with respect to said second power lead and embedded within said body of non-conductive material.

7. A premolded package as defined in claim 1, including a conductive dimple formed on said first power lead and disposed within said battery interface cavity for electric contacting engagement with a contact terminal of a back battery.

8. A premolded package as defined in claim 1, wherein said finger lead assembly includes a base plate and one of said conductive finger leads is electrically connected to said base plate, wherein said electronic circuit device is an LSI integrated circuit implemented on a semiconductor chip, said integrated circuit having a plurality of input/output nodes and a plurality of wire conductors connecting said input/output nodes to said conductive finger leads, said integrated circuit chip being mounted onto said base plate.

9. A premolded package assembly having an encapsulated electronic circuit device and a socket for receiving a replaceable battery for providing electrical power to said encapsulated electronic circuit device comprising, in combination:
a first body of non-conductive material having a support surface;

a finger lead assembly mounted onto said support surface, said finger lead assembly having a plurality of conductive finger leads extending across said support surface, with one of said finger leads defining a first polarity power lead, and exactly one of said finger leads defining a second polarity power lead having a terminal contact portion projecting externally of said first body of non-conductive material;

a second body of non-conductive material assembled onto said first body of non-conductive material and confining said finger lead assembly therebetween, said second body of non-conductive material being intersected by a device cavity for receiving an electronic circuit device;

an electronic circuit device disposed within said device cavity and having a plurality of input/output nodes electrically connected to said conductive finger leads;

said second body of non-conductive material being intersected by a battery interface cavity thereby exposing one of said power leads in the interface between said first and second non-conductive bodies, and said second body of non-conductive material having shoulder portions defining a socket cavity in open alignment with said battery interface cavity for receiving a backup battery, wherein a first polarity contact terminal of a backup battery is insertable into said interface cavity in electrical contact with said first power lead within said battery interface cavity when a backup battery is loaded into said socket cavity; and, the externally projecting terminal contact portion of said second polarity conductive power lead being disposed for releasable electrical contacting engagement with the second polarity contact terminal of a backup battery when a backup battery is loaded into said socket cavity, the externally projecting terminal contact portion applying a bias retaining force against said second polarity contact terminal.

10. In an electronic circuit package of the type having a circuit device including multiple input/output nodes encapsulated within a body of non-conductive material, a plurality of connector pins mounted onto said body of non-conductive material and projecting externally thereof, and a plurality of conductive finger leads encapsulated within said body of non-conductive material electrically connecting said input/output nodes to said connector pins, the improvement comprising:

said body of non-conductive material being intersected by an external socket for receiving a backup battery of the type having positive and negative polarity terminals, and said body of non-conductive material being intersected by a battery interface cavity which opens into said battery socket for exposing one of said conductive finger leads within said body of non-conductive material for electrical contacting engagement by a power terminal of a replaceable battery loaded within said external socket cavity; and, exactly one of said conductive finger leads defining a second power lead having a terminal contact portion projecting externally of said body of non-conducting material, the externally projecting terminal contact portion of said second conductive power lead being disposed for releasable electrical contacting engagement with the second polarity contact terminal of a backup battery when a backup battery is loaded into said socket, wherein the externally projecting terminal contact portion applies a bias retaining force against said second polarity contact terminal.

11. An integrated circuit package comprising, in combination:

a first body of non-conductive material having a support surface, a finger lead assembly mounted onto said support surface, said finger lead assembly having a base plate, and a plurality of conductive finger leads extending across said support surface, with one of said finger leads defining a first power lead, and one of said finger leads defining a second power lead having a terminal contact portion projecting externally of said first body of non-conductive material;

a second body of non-conductive material having a chip cavity for receiving an integrated circuit chip device, said second body being assembled onto said first body with said chip cavity providing a clearance opening about said base plate;

an integrated circuit chip mounted onto said base plate and received within the clearance opening of said chip cavity, said integrated circuit chip having a plurality of input/output nodes and a plurality of wire conductors connecting said input/output nodes to said conductive finger leads;

said second body of non-conductive material having a battery interface cavity providing an access opening to said first conductive power lead and having shoulder portions defining a socket cavity in open alignment with said interface cavity for receiving a backup battery, wherein a first polarity contact terminal of a backup battery is insertable into said interface cavity in electrical contact with said first power lead when a backup battery is loaded into said socket; and, the externally projecting terminal contact portion of said second conductive power lead being disposed for releasable electrical contacting engagement with the second polarity contact terminal of a backup battery when a backup battery is loaded into said socket, wherein the externally projecting terminal contact portion applies a bias retaining force against said second polarity contact terminal.

12. An integrated circuit package as defined in claim 11, wherein one of said power leads is attached to said base plate, and wherein said integrated circuit chip includes a substrate which is bonded onto said base plate.

13. An integrated circuit package as defined in claim 11, one of said socket shoulder portions having a semi-cylindrical sidewall defining a side boundary of said socket cavity, and said second body of non-conductive material having a planar support surface abutting said cylindrical sidewall and defining a bottom boundary of said socket cavity, wherein said interface cavity intersects said planar support surface and said second body of non-conductive material.

14. An integrated circuit package as defined in claim 11, said second body of non-conductive material having a notch formed on a side edge thereof thereby defining a clearance opening through which the externally projecting terminal contact portion of said second power lead is extended for contacting engagement with the second polarity contact terminal of a backup battery.

15. An integrated circuit package as defined in claim 11, said second power lead having an anchor tab portion extending transversely with respect to said second power lead and embedded within said first body of non-conductive material.

16. An integrated circuit package as defined in claim 11, including a conductive dimple formed on said first power lead and disposed within said battery interface cavity for electrical contacting engagement with the first polarity contact terminal of a backup battery.

17. An integrated circuit package as defined in claim 11, wherein said first and second non-conductive bodies are assembled together with said finger lead assembly disposed therebetween, including a deposit of insulating material in said chip cavity for sealing said integrated circuit chip and the exposed finger leads within said chip cavity.

18. An integrated circuit package as defined in claim 11, including:
   a backup battery received within said socket, said backup battery having a first polarity contact terminal received within said battery interface cavity and engaged in electrical contact with said first conductive power lead, and having a second polarity contact terminal disposed in electrical contact engagement with the externally projecting terminal contact portion of said second conductive power lead.

* * * * *